United States Patent
Lee et al.

(10) Patent No.: US 9,178,524 B1
(45) Date of Patent: Nov. 3, 2015

(54) HYBRID R-2R STRUCTURE FOR LOW GLITCH NOISE SEGMENTED DAC

(71) Applicant: QUALCOMM Incorporated, San Diego, CA (US)

(72) Inventors: Sang Min Lee, San Diego, CA (US); Dongwon Seo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/493,254

(22) Filed: Sep. 22, 2014

Related U.S. Application Data

(60) Provisional application No. 62/003,497, filed on May 27, 2014.

(51) Int. Cl.
| | |
|---|---|
| *H03M 1/66* | (2006.01) |
| *H03M 1/08* | (2006.01) |
| *H03M 1/68* | (2006.01) |
| *H03M 1/78* | (2006.01) |

(52) U.S. Cl.
CPC ............ *H03M 1/0881* (2013.01); *H03M 1/687* (2013.01); *H03M 1/785* (2013.01)

(58) Field of Classification Search
CPC ..... H03M 1/0881; H03M 1/66; H03M 1/687; H03M 1/78; H03M 1/785
USPC .................................................. 341/144–145
See application file for complete search history.

(56) References Cited

U.S. PATENT DOCUMENTS

| | | | | |
|---|---|---|---|---|
| 6,583,744 | B2 * | 6/2003 | Bright ................. | H03M 1/0604 341/118 |
| 7,042,381 | B1 * | 5/2006 | Pan ...................... | H03M 1/0602 341/153 |
| 7,242,338 | B2 * | 7/2007 | Jiang et al. ..................... | 341/154 |
| 7,283,082 | B1 | 10/2007 | Kuyel | |
| 7,679,538 | B2 * | 3/2010 | Tsang ........................... | 341/144 |
| 8,330,634 | B2 * | 12/2012 | Li et al. ......................... | 341/154 |
| 8,421,662 | B2 * | 4/2013 | Kon ....................... | H03M 1/687 341/145 |

(Continued)

FOREIGN PATENT DOCUMENTS

EP 2019490 A1 1/2009

OTHER PUBLICATIONS

Lin Y., et al., "Resistors Layout for Enhancing Yield of R-2R DACs," Circuits and Systems, 2002. ISCAS 2002. IEEE International Symposium on, 2002, vol. 5, pp. V-97-V-100.

(Continued)

*Primary Examiner* — Khai M Nguyen
(74) *Attorney, Agent, or Firm* — Arent Fox LLP

(57) ABSTRACT

The apparatus may be an N-bit DAC including ($2^M$–1) parallel stages associated with M most significant bits, and (N-M) stages associated with (N-M) least significant bits. The ($2^M$–1) parallel stages may deliver a first current to current-summing nodes of the DAC. The (N-M) stages may include a resistive network and a second pair of switches, and may deliver a second current to the resistive network of the stage. Each resistive network may scale the respectively delivered currents according to a binary weight of a stage corresponding to the resistive network, and may deliver the scaled currents to the pair of current-summing nodes. At least one of the (N-M) stages may be separated from the remaining stages.

30 Claims, 14 Drawing Sheets

(56) References Cited

U.S. PATENT DOCUMENTS

| | | | |
|---|---|---|---|
| 8,896,472 B2 * | 11/2014 | Seo et al. | 341/145 |
| 2003/0001766 A1 | 1/2003 | Song | |
| 2004/0257254 A1 | 12/2004 | Jiang et al. | |
| 2006/0092065 A1 | 5/2006 | Pan | |
| 2010/0213983 A1 | 8/2010 | Eschauzier et al. | |
| 2011/0282924 A1 | 11/2011 | Mallinson | |
| 2013/0293405 A1 | 11/2013 | Medina | |

OTHER PUBLICATIONS

International Search Report and Written Opinion—PCT/US2015/029535—ISA/EPO—Aug. 3, 2015.

\* cited by examiner

HYBRID R-2R STRUCTURE FOR LOW GLITCH NOISE SEGMENTED DAC

CROSS-REFERENCE TO RELATED APPLICATION

This application claims the benefit of U.S. Provisional Application Ser. No. 62/003,497, entitled "HYBRID R-2R STRUCTURE FOR LOW GLITCH NOISE SEGMENTED DAC," and filed on May 27, 2014, which is expressly incorporated by reference herein in its entirety.

BACKGROUND

1. Field

The present disclosure relates generally to communication systems, and more particularly, to a hybrid R-2R structure for low glitch noise segmented digital-to-analog converter (DAC).

2. Background

A wireless device (e.g., a cellular phone or a smartphone) may transmit and receive data for two-way communication with a wireless communication system. The wireless device may include a transmitter for data transmission and a receiver for data reception. For data transmission, the transmitter may modulate a transmit local oscillator (LO) signal with data to obtain a modulated radio frequency (RF) signal, amplify the modulated RF signal to obtain an output RF signal having the desired output power level, and transmit the output RF signal via an antenna to a base station. Additionally, the transmitter may include a DAC to assist in the generation of the output RF signal that is transmitted.

A DAC converts digital signals (e.g., a 4-bit DAC converts a digital word of four bits, such as a digital signal of 0110) into a corresponding current or a corresponding analog voltage. A four-bit DAC will produce a different analog voltage value, or a different amount of current, for each possible digital value. That is, the four-bit DAC will produce a different current or analog voltage for each value of the digital signal from 0000 to 1111.

Low-noise, low-power, wideband, and high-resolution DACs are increasingly sought for advanced wireless standards, such as long term evolution (LTE), in which the DAC is modified for higher data rates or bandwidth. Such DACs may typically limit architecture and design choices.

For a transmit (TX) DAC used in RF applications, minimizing high frequency glitch noise, also referred to as DAC noise, at certain offset frequencies may avoid certain operational issues in a broadband cellular TX path. That is, it may be useful to reduce or to cancel such glitch noise, because the noise may desensitize an associated receive (RX) channel. In other words, out-of-band noise from the TX DAC can fall into the RX-band, and thereby desensitize the RX channel. Such out-of-band noise may be an issue of particular concern for the surface-acoustic-wave filterless LTE (SAW-less LTE) system.

Attempts to reduce glitch noise may address glitch-noise mismatch between most significant bits (MSBs) of a DAC and least significant bits (LSBs) of the DAC, may require careful scaling, or may take into consideration robustness to process, voltage, and temperature (PVT) variations. For example, an approach to optimize delay between MSBs and LSBs may result in relatively high PVT variations, wherein the DAC may produce different analog voltages/currents for an identical digital signal depending on process variation, how long the DAC has been operating, or depending on a temperature of the DAC.

Another approach may be to increase the resolution of the DAC to lower the entire quantization noise floor. However, such an implementation may be expensive, due to significant resultant increases in area, power, or voltage headroom.

SUMMARY

In an aspect of the disclosure, a method and an apparatus are provided. The apparatus may be an N-bit DAC. The N-bit DAC may include $(2^M-1)$ parallel stages associated with M most significant bits of the DAC, and (N-M) stages associated with (N-M) least significant bits of the DAC. Each stage of the $(2^M-1)$ parallel stages may be configured to generate and to deliver a first current to a pair of current-summing nodes of the DAC via a first pair of switches responsive to differential data. Each stage of the (N-M) stages may include a resistive network and a second pair of switches. Each stage of the (N-M) stages may be configured to generate and to deliver a second current via a second pair of switches of the stage to the resistive network of the stage in response to differential data. Each resistive network may be configured to scale the respectively delivered currents according to a binary weight of a stage corresponding to the resistive network, and to deliver the scaled currents to the pair of current-summing nodes. At least one of the (N-M) stages may be separated from all remaining stages of the N-bit DAC.

In an aspect of the disclosure, a method and an apparatus are provided. The method may be a method of converting an N-bit digital signal to an analog signal. The method may include generating a first current in each stage of $(2^M-1)$ parallel stages associated with M most significant bits of the digital data, delivering each of the first currents to a pair of current-summing nodes via a first pair of switches responsive to differential data, generating a second current in each stage of (N-M) stages associated with (N-M) least significant bits of the digital data, at least one of the (N-M) stages being separated from all remaining stages of the N-bit DAC, delivering to each network of (N-M) resistive networks the second current generated in its associated stage via a second pair of switches responsive to differential data, each associated with a different one of the (N-M) stages, scaling the respectively delivered currents in accordance with a binary weight of a stage corresponding to the resistive network, delivering the scaled currents to the pair of current-summing nodes, maintaining an impedance of each node of the pair of current-summing nodes within a range defined by a gain value, and maintaining a voltage difference between the current-summing nodes within a range defined by the gain value. The difference in the scaled currents delivered to different nodes of the pair of current-summing nodes may define a value of the analog signal.

DETAILED DESCRIPTION

Figure 1:
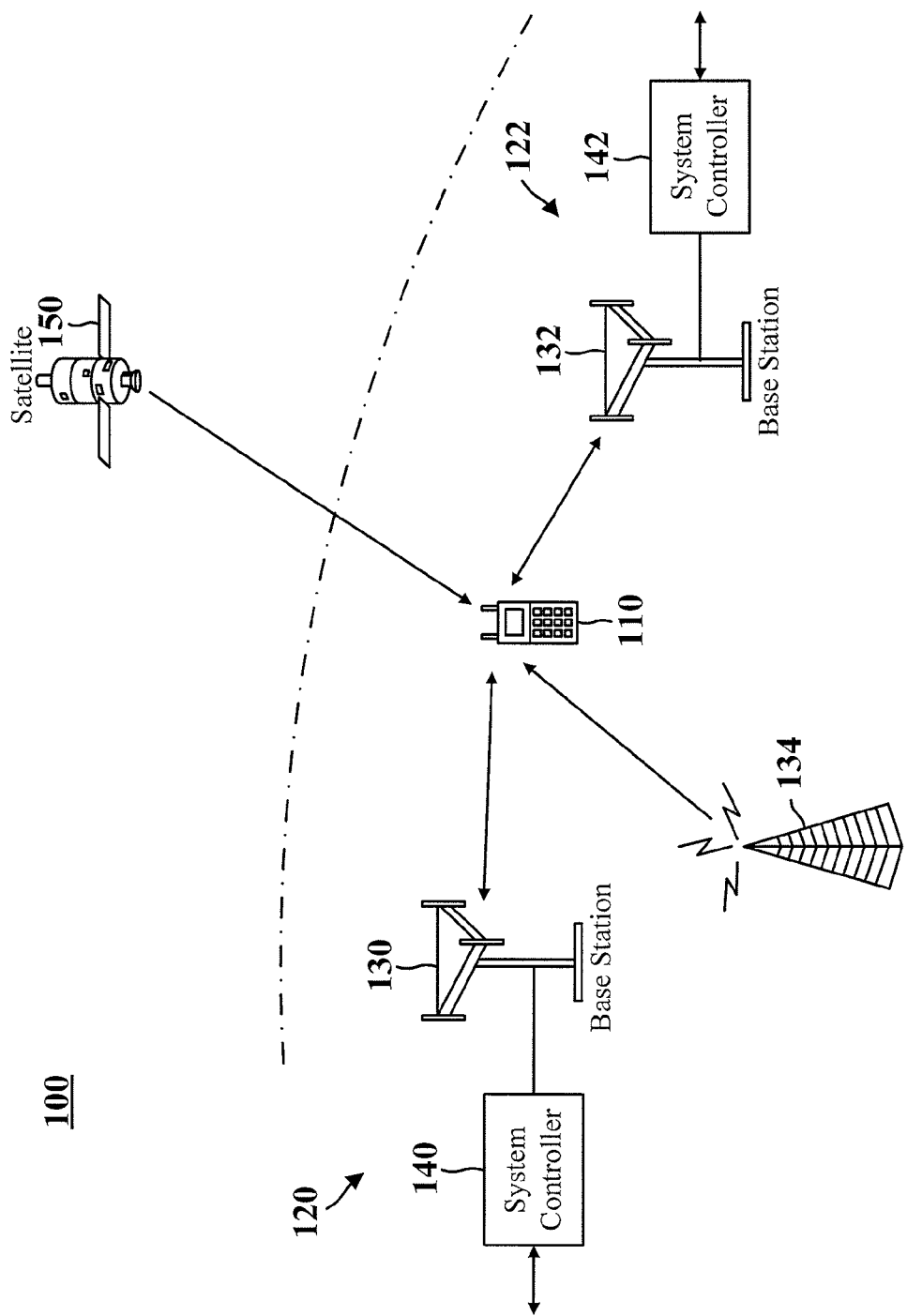
FIG. 1 illustrates a wireless device communicating with different wireless communication systems.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise random-access memory (RAM), read-only memory (ROM), electronically erasable programmable ROM (EEPROM), compact disk (CD) ROM (CD-ROM), or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

FIG. 1 is a diagram 100 illustrating a wireless device 110 communicating with different wireless communication systems 120, 122. The wireless systems 120, 122 may each be a Code Division Multiple Access (CDMA) system, a Global System for Mobile Communications (GSM) system, an LTE system, a wireless local area network (WLAN) system, or some other wireless system. A CDMA system may implement Wideband CDMA (WCDMA), CDMA 1X or cdma2000, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, the wireless system 120 may be a GSM system, and the wireless system 122 may be a WCDMA system. As another example, the wireless system 120 may be an LTE system, and the wireless system 122 may be a CDMA system.

For simplicity, the diagram 100 shows the wireless system 120 including one base station 130 and one system controller 140, and the wireless system 122 including one base station 132 and one system controller 142. In general, each wireless system may include any number of base stations and any set of network entities. Each base station may support communication for wireless devices within the coverage of the base station. The base stations may also be referred to as a Node B, an evolved Node B (eNB), an access point, a base transceiver station, a radio base station, a radio transceiver, a transceiver function, a basic service set (BSS), an extended service set (ESS), or some other suitable terminology. The wireless device 110 may also be referred to as a user equipment (UE), a mobile device, a remote device, a wireless device, a wireless communications device, a station, a mobile station, a subscriber station, a mobile subscriber station, a terminal, a mobile terminal, a remote terminal, a wireless terminal, an access terminal, a client, a mobile client, a mobile unit, a subscriber unit, a wireless unit, a remote unit, a handset, a user agent, or some other suitable terminology. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, or some other similar functioning device.

The wireless device 110 may be capable of communicating with the wireless system 120 and/or 122. The wireless device 110 may also be capable of receiving signals from broadcast stations, such as the broadcast station 134. The wireless device 110 may also be capable of receiving signals from satellites, such as the satellite 150, in one or more global navigation satellite systems (GNSS). The wireless device 110 may support one or more radio technologies for wireless communication such as GSM, WCDMA, cdma2000, LTE, 802.11, etc. The terms "radio technology," "radio access technology," "air interface," and "standard" may be used interchangeably.

The wireless device 110 may communicate with a base station in a wireless system via the downlink and the uplink. The downlink (or forward link) refers to the communication link from the base station to the wireless device, and the uplink (or reverse link) refers to the communication link from the wireless device to the base station. A wireless system may utilize TDD and/or FDD. For TDD, the downlink and the uplink share the same frequency, and downlink transmissions and uplink transmissions may be sent on the same frequency in different time periods. For FDD, the downlink and the uplink are allocated separate frequencies. Downlink transmissions may be sent on one frequency, and uplink transmissions may be sent on another frequency. Some exemplary radio technologies supporting TDD include GSM, LTE, and TD-SCDMA. Some exemplary radio technologies supporting FDD include WCDMA, cdma2000, and LTE.

Figure 2:
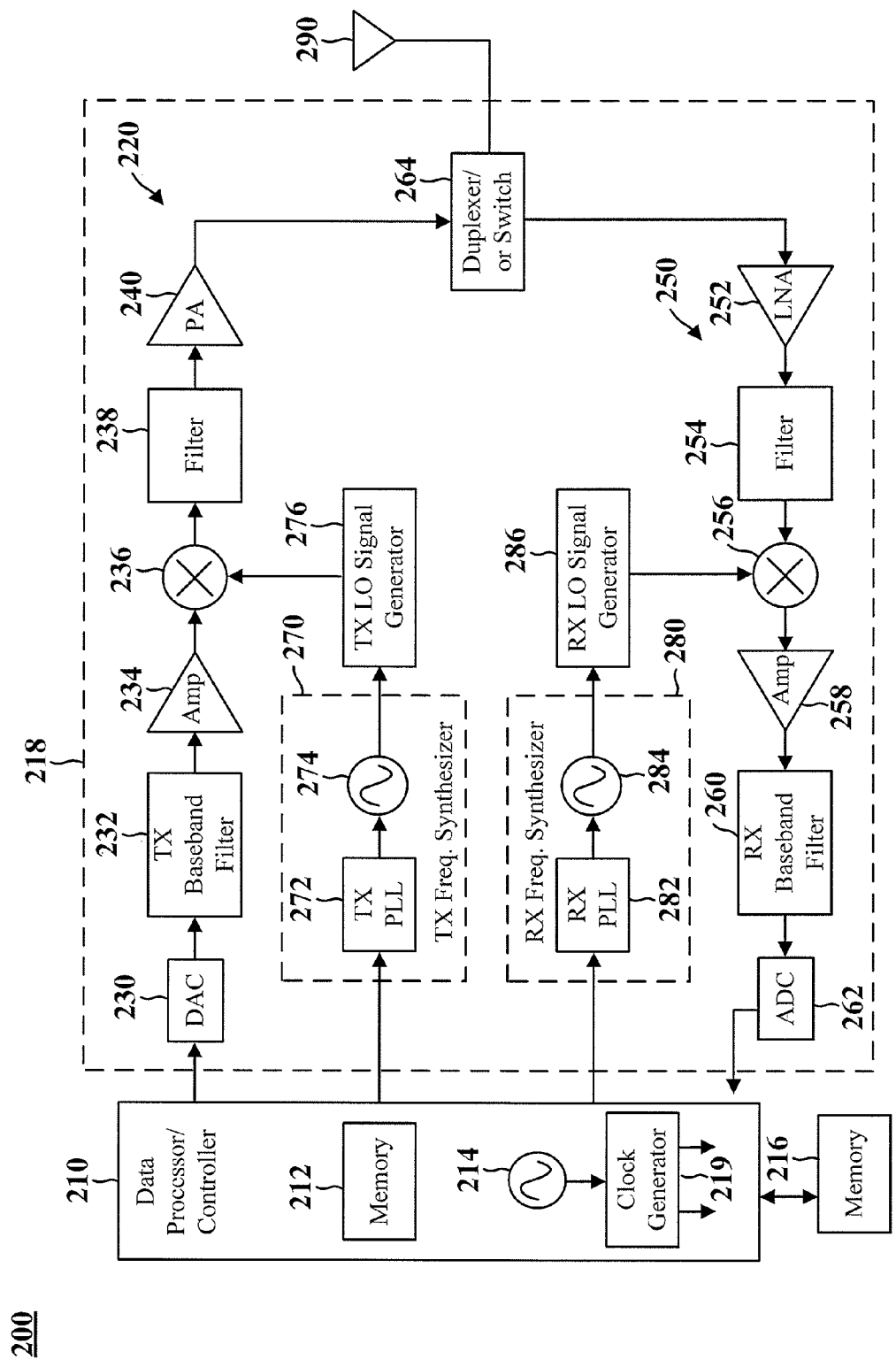
FIG. 2 is a block diagram of a wireless device.

FIG. 2 is a block diagram 200 of an exemplary wireless device, such as the wireless device 110. The wireless device includes a data processor/controller 210, a transceiver 218, and an antenna 290, and may further include memory 216. The transceiver 218 includes a transmitter 220 and a receiver 250 that support bi-directional communication. The transmitter 220 and/or the receiver 250 may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary design shown in FIG. 2, the transmitter 220 and the receiver 250 are implemented with the direct-conversion architecture.

In the transmit path, the data processor/controller 210 may process (e.g., encode and modulate) data to be transmitted and provide the data to a DAC 230. The DAC 230 converts a digital input signal to an analog output signal. The analog output signal is provided to a TX baseband (lowpass) filter 232, which may filter the analog output signal to remove images caused by the prior digital-to-analog conversion by the DAC 230. An amplifier (amp) 234 may amplify the signal from the TX baseband filter 232 and provide an amplified baseband signal. An upconverter (mixer) 236 may receive the amplified baseband signal and a TX LO signal from a TX LO signal generator 276. The upconverter 236 may upconvert the amplified baseband signal with the TX LO signal and provide an upconverted signal. A filter 238 may filter the upconverted signal to remove images caused by the frequency upconversion. A power amplifier (PA) 240 may amplify the filtered RF signal from the filter 238 to obtain the desired output power level and provide an output RF signal. The output RF signal may be routed through a duplexer/switchplexer 264.

For FDD, the transmitter 220 and the receiver 250 may be coupled to the duplexer 264, which may include a TX filter for the transmitter 220 and a RX filter for the receiver 250. The TX filter may filter the output RF signal to pass signal components in a transmit band and attenuate signal components in a receive band. For TDD, the transmitter 220 and the receiver 250 may be coupled to switchplexer 264. The switchplexer 264 may pass the output RF signal from the transmitter 220 to the antenna 290 during uplink time intervals. For both FDD and TDD, the duplexer/switchplexer 264 may provide the output RF signal to the antenna 290 for transmission via a wireless channel.

In the receive path, the antenna 290 may receive signals transmitted by base stations and/or other transmitter stations and may provide a received RF signal. The received RF signal may be routed through duplexer/switchplexer 264. For FDD, the RX filter within the duplexer 264 may filter the received RF signal to pass signal components in a receive band and attenuate signal components in the transmit band. For TDD, the switchplexer 264 may pass the received RF signal from the antenna 290 to the receiver 250 during downlink time intervals. For both FDD and TDD, the duplexer/switchplexer 264 may provide the received RF signal to the receiver 250.

Within the receiver 250, the received RF signal may be amplified by a low noise amplifier (LNA) 252 and filtered by a filter 254 to obtain an input RF signal. A downconverter (mixer) 256 may receive the input RF signal and an RX LO signal from an RX LO signal generator 286. The downconverter 256 may downconvert the input RF signal with the RX LO signal and provide a downconverted signal. The downconverted signal may be amplified by an amplifier 258 and further filtered by an RX baseband (lowpass) filter 260 to obtain an analog input signal. The analog input signal is provided to an analog-to-digital converter (ADC) 262. The ADC 262 converts an analog input signal to a digital output signal. The digital output signal is provided to the data processor/controller 210.

A TX frequency synthesizer 270 may include a TX phase locked loop (PLL) 272 and a VCO 274. The VCO 274 may generate a TX VCO signal at a desired frequency. The TX PLL 272 may receive timing information from the data processor/controller 210 and generate a control signal for the VCO 274. The control signal may adjust the frequency and/or the phase of the VCO 274 to obtain the desired frequency for the TX VCO signal. The TX frequency synthesizer 270 provides the TX VCO signal to the TX LO signal generator 276. The TX LO signal generator 276 may generate a TX LO signal based on the TX VCO signal received from the TX frequency synthesizer 270.

A RX frequency synthesizer 280 may include an RX PLL 282 and a VCO 284. The VCO 284 may generate an RX VCO signal at a desired frequency. The RX PLL 282 may receive timing information from the data processor/controller 210 and generate a control signal for the VCO 284. The control signal may adjust the frequency and/or the phase of the VCO 284 to obtain the desired frequency for the RX VCO signal. The RX frequency synthesizer 280 provides the RX VCO signal to the RX LO signal generator 286. The RX LO signal generator may generate an RX LO signal based on the RX VCO signal received from the RX frequency synthesizer 280.

The LO signal generators 276, 286 may each include frequency dividers, buffers, etc. The LO signal generators 276, 286 may be referred to as frequency dividers if they divide a frequency provided by the TX frequency synthesizer 270 and the RX frequency synthesizer 280, respectively. The PLLs 272, 282 may each include a phase/frequency detector, a loop filter, a charge pump, a frequency divider, etc. Each VCO signal and each LO signal may be a periodic signal with a particular fundamental frequency. The TX LO signal and the RX LO signal from the LO generators 276, 286 may have the same frequency for TDD or different frequencies for FDD. The TX VCO signal and the RX VCO signal from the VCOs 274, 284 may have the same frequency (e.g., for TDD) or different frequencies (e.g., for FDD or TDD).

The conditioning of the signals in the transmitter 220 and the receiver 250 may be performed by one or more stages of amplifier, filter, upconverter, downconverter, etc. These circuits may be arranged differently from the configuration shown in FIG. 2. Furthermore, other circuits not shown in FIG. 2 may also be used to condition the signals in the transmitter 220 and the receiver 250. For example, impedance matching circuits may be located at the output of the PA 240, at the input of the LNA 252, between the antenna 290 and the duplexer/switchplexer 264, etc. Some circuits in FIG. 2 may also be omitted. For example, the filter 238 and/or the filter 254 may be omitted. All or a portion of the transceiver 218 may be implemented on one or more analog integrated circuits (ICs), RF ICs (RFICs), mixed-signal ICs, etc. For example, the TX baseband filter 232 to the PA 240 in the transmitter 220, the LNA 252 to the RX baseband filter 260 in the receiver 250, the PLLs 272, 282, the VCOs 274, 284, and the LO signal generators 276, 286 may be implemented on an RFIC. The PA 240 and possibly other circuits may also be implemented on a separate IC or a circuit module.

The data processor/controller 210 may perform various functions for the wireless device. For example, the data processor/controller 210 may perform processing for data being transmitted via the transmitter 220 and received via the receiver 250. The data processor/controller 210 may control the operation of various circuits within the transmitter 220 and the receiver 250. The memory 212 and/or the memory 216 may store program codes and data for the data processor/controller 210. The memory may be internal to the data processor/controller 210 (e.g., the memory 212) or external to the data processor/controller 210 (e.g., the memory 216). The memory may be referred to as a computer-readable medium. An oscillator 214 may generate a VCO signal at a particular frequency. A clock generator 219 may receive the VCO signal from the oscillator 214 and may generate clock signals for various modules within the data processor/controller 210. The data processor/controller 210 may be implemented on one or more application specific integrated circuits (ASICs) and/or other ICs.

The DAC 230 shown in FIG. 2 may be, for example, an N-bit DAC with an R-2R structure. An approach to reduce the previously mentioned glitch noise in a DAC may be to eliminate the root-cause of glitch noises for segmented DACs by scaling currents in LSBs using an R-2R structure with the same current sources as those in MSBs, which may be potentially accomplished without accurate switch scaling.

Figure 3:
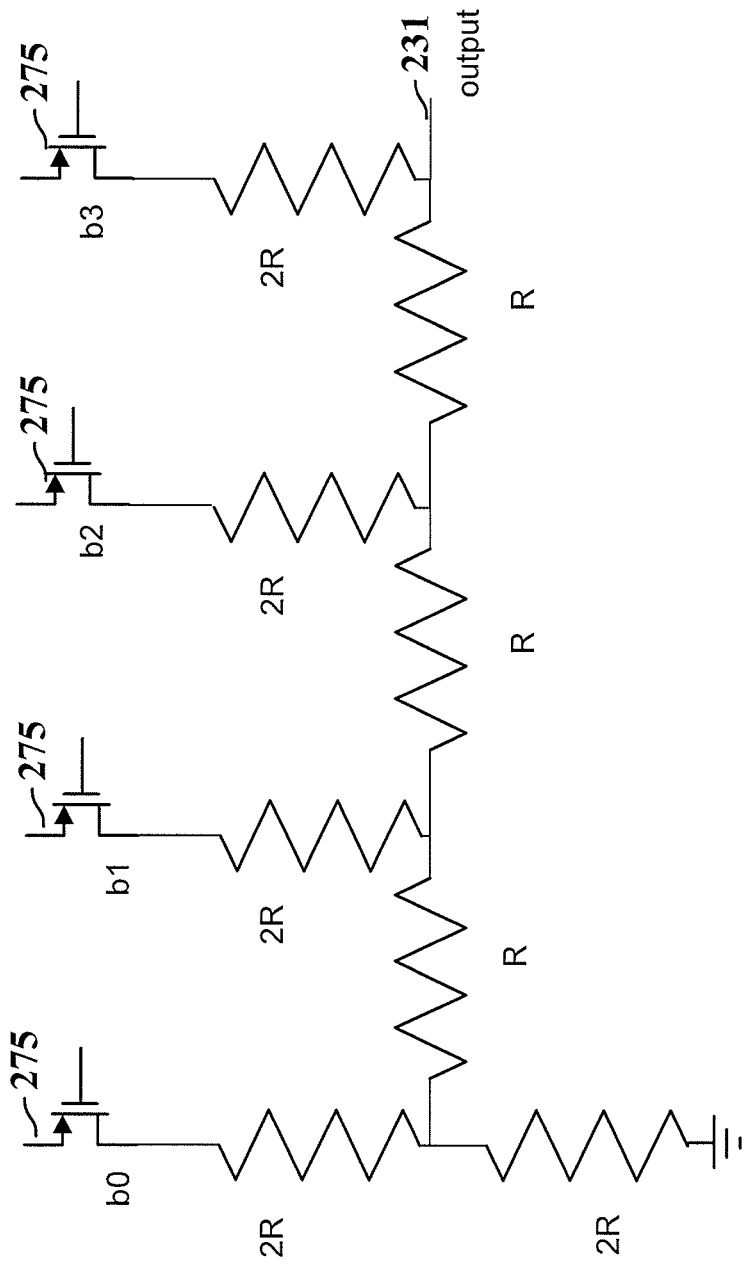
FIG. 3 is a diagram illustrating a 4-bit DAC of an R-2R structure.

FIG. 3 is a diagram illustrating a 4-bit DAC of an R-2R structure. A DAC with an R-2R structure utilizes what is referred to as an R-2R resistor ladder network. The R-2R resistor ladder network enables the conversion of a parallel digital symbol (e.g., 4-bits b0-b3) into a current or an analog voltage, which may be measured at the output 231). Each of the four digital inputs (b0-b3) adds a respective weighted contribution to the analog output 231, and no two different 4-bit words (from 0000 to 1111) will result in an identical current or voltage at the output 231.

A switch 275 for each of the bits b0-b3 may be operated according to whether a value on a particular one of the bits b0-b3 is 1 or 0. Accordingly, the value of the digital signal into the DAC can be created by operation of switches 275 that control the bits of the DAC. For example, a closed switch 275 for a particular bit may correspond to the bit representing a "1" for the position of the bit within the digital symbol, while an open switch corresponds to the bit representing a "0." Accordingly, if all of the switches for controlling the bits of the DAC are open (e.g., if all four switches of a four-bit DAC are open to produce a digital symbol of 0000), then no current flows into the resistor ladder, and no current or voltage is produced at the output 231.

By continuing (or reducing) the R-2R pattern of the resistor ladder shown in FIG. 3, an R-2R resistor ladder network can be scaled to any number of bits. Furthermore, only two different resistor values are used to construct the R-2R structure. For example, if the value of the "R" resistors in FIG. 3 is 3 ohms, then the value of the resistors represented by "2R" is 6 ohms (i.e., twice the value of the resistors represented by "R"). Because only two resistor values are used, the R-2R resistor ladder network may be easily and accurately produced and integrated into a circuit.

Accordingly, by using an R-2R resistor ladder-based DAC (e.g., an "R-2R DAC"), one can produce analog voltages from digital values, wherein the LSB (e.g., b3) contributes a largest percentage of the current or analog voltage to the output, while the MSB (e.g., b0) contributes a smallest percentage of the current or analog voltage to the output.

However, a standard R-2R DAC might not sufficiently overcome parasitic capacitance issues that arise during the implementation of such segmented DACs, and that may add to degradation of RX-band noise due to glitch energy being unevenly distributed, despite the designed R-2R values.

Figure 4A:
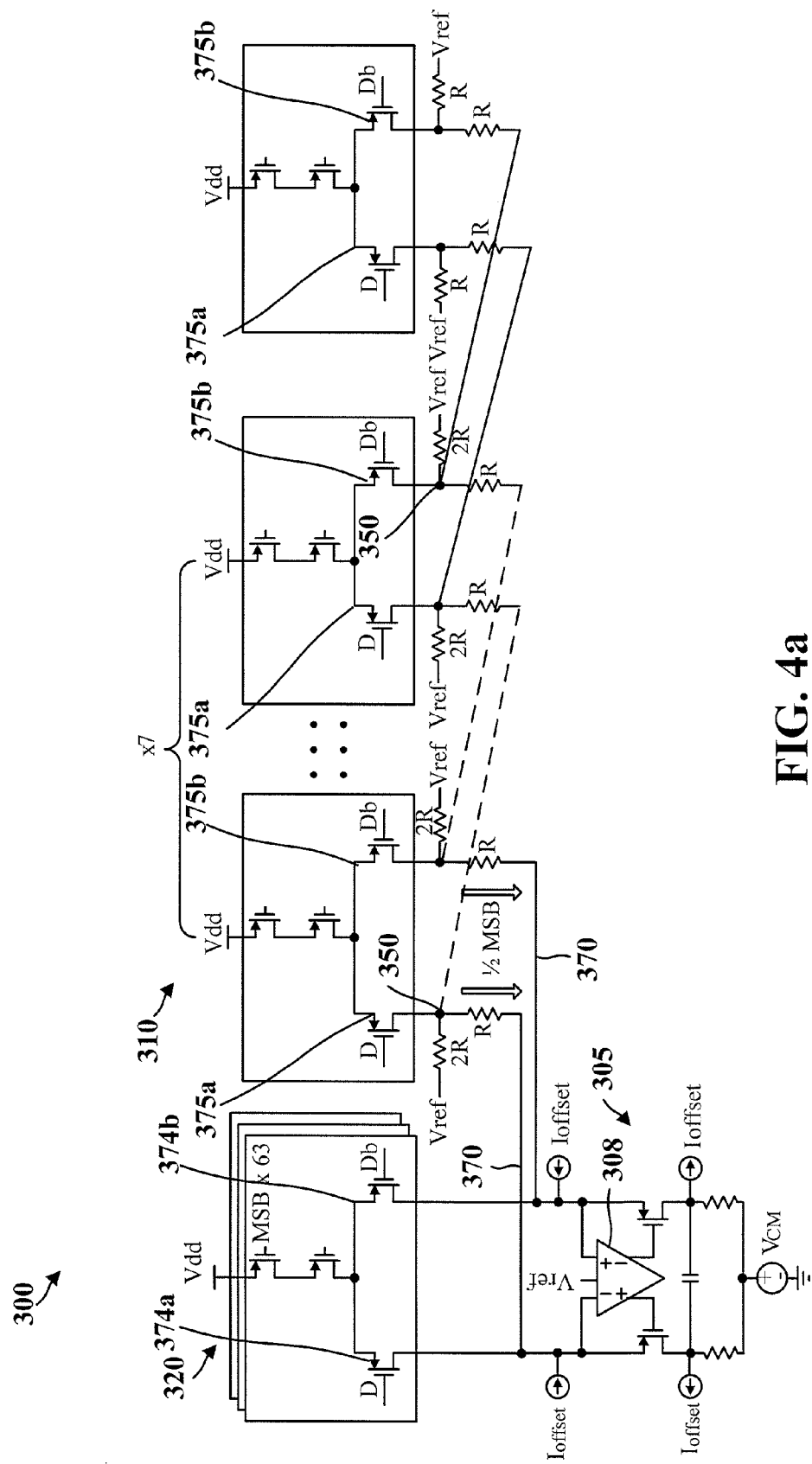
FIG. 4a is a diagram illustrating a DAC of an R-2R structure with LSB segmentation.

FIG. 4a is a diagram illustrating a DAC 300 of an R-2R structure with LSB segmentation. A segmented DAC is, essentially, a DAC that is designed to combine two or more individual DACs. The two or more DACs are combined in a single higher resolution DAC that is able to perform in ways that the two or more DACs are individually unable to perform. Accordingly, one portion of the segmented DAC (e.g., one of the individual DACs) generally handles the MSBs, while another portion of the segmented DAC (e.g., another one of the individual DACs) handles the LSBs. In the combination of the individual DACs to form the segmented DAC, the outputs (e.g., voltages or currents) of the two individual DACs are summed in some manner.

The DAC 300 shown in FIG. 4a is, for example, a 14-bit DAC with 8-bit LSB 310 (e.g., eight (8) least significant bits), which utilize an R-2R structure, and 6-bit MSB 320 (e.g., six (6) most significant bits) that do not have an R-2R structure. Because new wireless standards simultaneously demand high bandwidth and high resolution or low noise floor, a new architectural breakthrough other than widely-used current split segmentation architecture may be useful. A possible approach is to use a segmented current-steering DAC 300 to address DAC noise.

For example, glitch noise, or RX noise, in the segmented DAC 300 may mainly come from a delay difference between the 6 MSBs 320 and the remaining 8 LSBs 310. That is, when operating switches of a DAC (e.g., switches 375a and 375b of the resistor ladder in FIG. 3), because the switches might not operate synchronously due to time skew between bits of incoming digital data, momentary surges in current through the DAC may result in glitch noise. This noise may be reduced by matching the glitch noise of the MSBs 320 to that of the LSBs 310. As previously mentioned, such glitch-noise matching can be achieved by designing and adjusting a delay between the MSB 320 and the LSB 310 segmentation, although such a solution fails to provide robustness across PVT variations. Glitch noise can also be addressed by scaling, although design may require careful scaling of LSB current sources, switches, and switch drivers.

The glitch noise may be significantly reduced at higher frequencies by utilizing R-2R DAC segmentation for LSBs, and by additionally providing a hybrid R-2R architecture which allows flexibility in both design and layout, while overcoming parasitic capacitance issues that may arise during implementation of segmented DACs, as will be discussed below. For example, the glitch noise-matching may be achieved by retaining the same structure of the DAC up to the switch 375a/375b (e.g., the portion of the DAC above and including the switches 375a/375b in FIG. 4a), while scaling the current. That is, the R-2R structure can be utilized for the scaling of the current.

For example, in FIG. 4a, the current exiting one of the switches 375a/375b of the leftmost LSB 310 is represented by a value "MSB" (e.g., current $I_{MSB}$). Upon reaching node 350, due to the R-2R structure, the current MSB is theoretically evenly split such that a current of ½ MSB travels into the current-summing node 370 while the other ½ MSB goes to Vref. The LSB to the right of the leftmost LSB 310 has a current of ¼ MSB travel into the current-summing node 370, while the LSB to the right of that has ⅛ MSB travel into the current-summing node 370, and so on. Accordingly, a different value of current will travel into the current-summing nodes 370 no matter what the value of the digital word into the DAC is (e.g., a different value of current for each of the possible configurations of the operation of the switches 375a/375b), thus enabling the DAC to have a different analog value output (e.g., a different current output) to represent every possible digital value.

Furthermore, the DAC 300 may utilize an impedance attenuator 305 including a differential amplifier 308 coupled to a pair of current-summing/current-merging nodes 370. The impedance attenuator 305 can maintain an impedance of each of the current-summing nodes 370, and can maintain a voltage difference between the current-summing nodes 370 within a range defined by a gain of the differential amplifier 308.

Respective currents of each of the bits of the DAC flow from corresponding switch outputs into the current-summing nodes 370, at which point the respective currents corresponding to respective bits of the DAC are summed together. That is, the current-summing nodes 370 are the nodes where the switch outputs of each of the bits merge. Accordingly, if the switches "D" 375a of the DAC 300 are opened corresponding to a digital value in which each bit is a "0," then no current passes from the switch 375a into the current-merging nodes 370 corresponding to the "D" transistors. It should be noted that the pairs of switches 375a/375b corresponding to each bit of the DAC are a differential pair, meaning that when one switch 375a is on, the other switch 375b of the differential pair is off, and vice versa. Accordingly, if each "D" switch 375a is open, then every "Db" 375b switch will be closed.

Figure 4B:
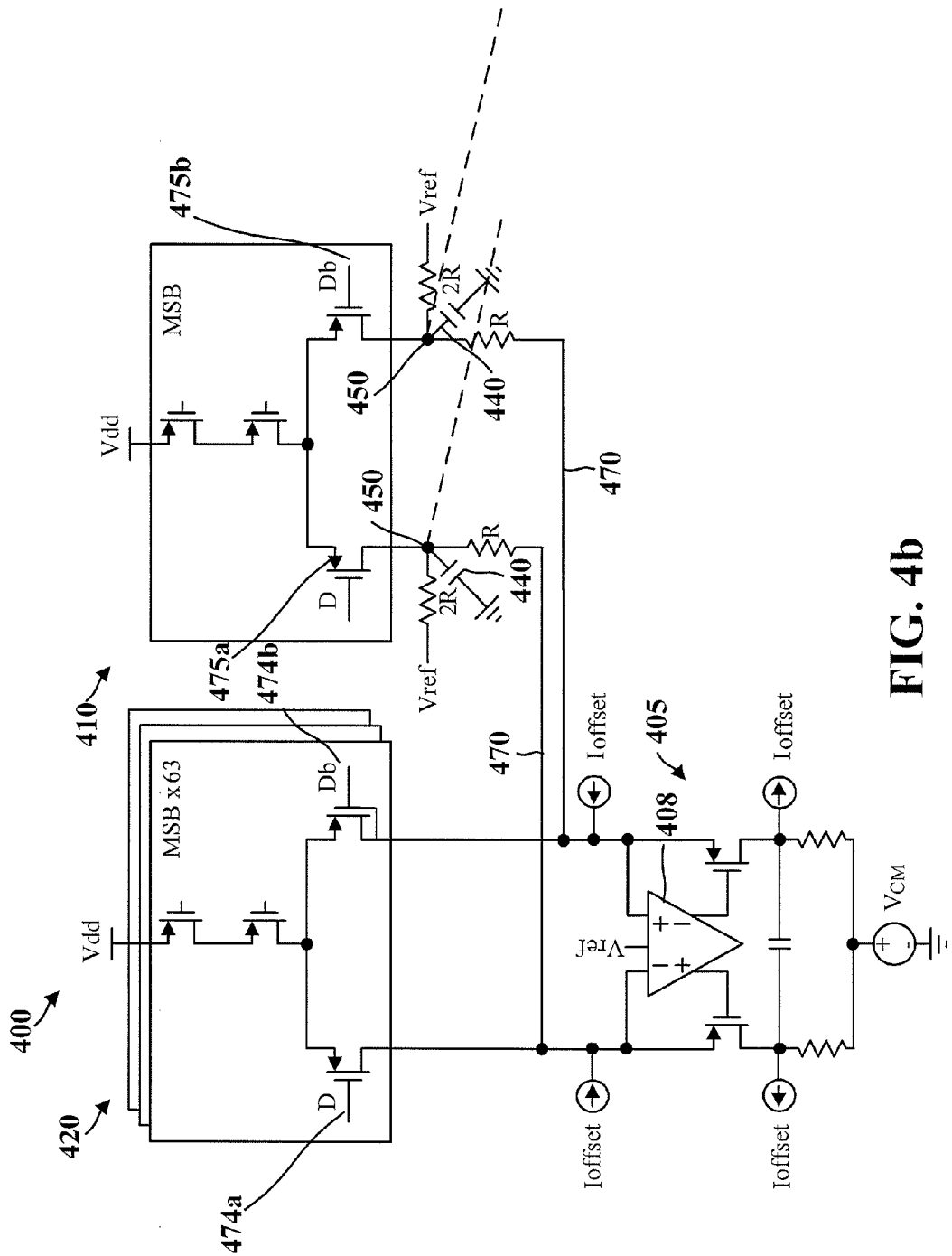
FIG. 4b is a diagram illustrating the DAC shown in FIG. 4a with parasitic capacitance.

FIG. 4b is a diagram illustrating the DAC 400 shown in FIG. 4a with parasitic capacitance. Referring to FIG. 4b, when the structure shown in FIG. 4a is implemented in real-world settings, performance of the DAC 400 may suffer from parasitic capacitance 440 (e.g., equivalent capacitance occurring between the wiring and elements of the structure of the circuit, and the substrate on which the wiring and elements are placed). The parasitic capacitance of the DAC 400 is represented by capacitors (e.g., parasitic capacitors) 440, which are not actual electronic components included as part of the DAC. FIG. 4b depicts the parasitic capacitance 440 attached to the R-2R nodes 450 (i.e., nodes between adjacent resistors having a resistor value of R and a resistor value of 2R). Even though there are varying degrees of parasitic capacitance occurring throughout the structure shown in FIG. 4b, the illustrated capacitors 440, which represent the parasitic capacitance, are of particular interest in terms of glitch noise reduction, as will be explained further below.

The glitch noise of the DAC 400 generally has energy concentrated mainly at higher frequencies. Therefore, when there are glitches generated from operation of the switches 475a/475b of the various bits of the DAC 400 (e.g., glitches generated due to asynchronicity of switch operation, as the switches 475a/475b are driven by switch drivers coupled to the gates of the transistors/switches 475a/475b), some portion of glitch noise will flow to the portion(s) of the DAC structure that cause the parasitic capacitance 440. Accordingly, this portion of the glitch noise will not flow to the outputs/current-summing nodes 470, although a majority of the glitch noise from the MSB cells 420 will still flow to the current-summing nodes 470. This disparity in glitch noise energy for each bit creates an imbalance between the MSBs 420 and the LSBs 410, which may in turn cause the glitch noise to increase due to variance in glitch noise distribution (i.e., due to the glitch noise not being divided evenly between the two differential paths). However, by adding capacitors (e.g., feedforward capacitors) to the DAC 400 to match impedance, the noise can be divided more equally despite the parasitic capacitance 440.

Figure 5:
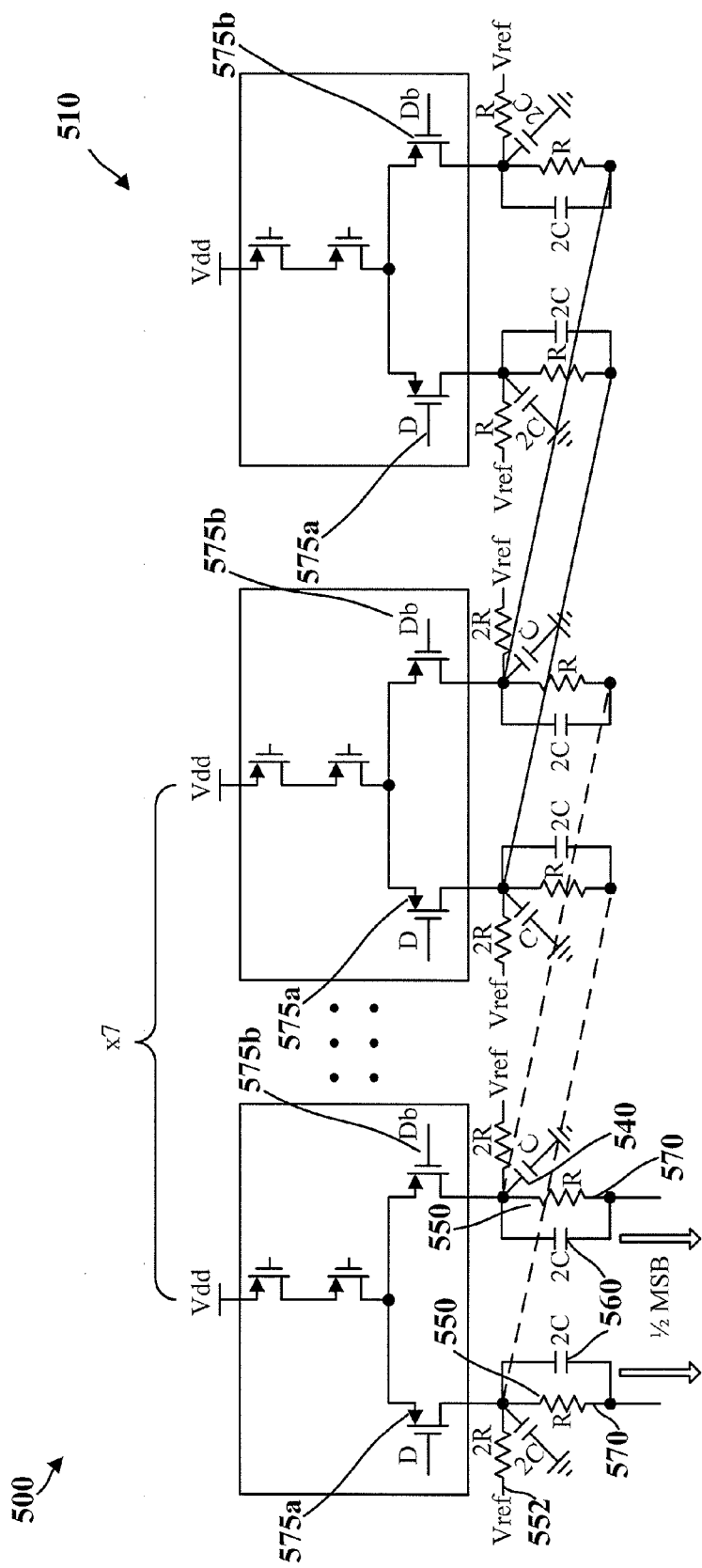
FIG. 5 is a diagram illustrating a portion of a DAC of an R-2R structure with LSB segmentation and with matched impedance.

FIG. 5 is a diagram illustrating a portion of a DAC 500 of an R-2R structure with LSB segmentation and with matched impedance. Referring to FIG. 5, glitch noise caused by the aforementioned parasitic capacitance 540 can be reduced by providing additional capacitors, which may be referred to as "feedforward capacitors" 560. These feedforward capacitors 560 can be connected to respective R-2R nodes 550 and to respective outputs 570 to thereby "feedforward" the glitch energy. When feedforward capacitance is twice that of the parasitic capacitance (e.g., when the capacitance of the feedforward capacitors 560 is 2C, or for example, 60fF, while the parasitic capacitance 540 is C, or for example, 30fF), then the total impedance at the switch output of the leftmost LSB of the LSBs 510 (the switch output being directly connected to the current-summing node 570) is a value equivalent to R parallel with 2C for both of the Vref nodes 552 and the current-summing/current-merging nodes 570 (R representing a value of resistance of a first resistor in the R-2R structure).

Simulations show that adding the feedforward capacitors 560 to the DAC 500 reduces the out-of-band noise to a level in a manner similar to a simulation without parasitic capacitances (e.g., when a computer simulation is run on a circuit diagram of a DAC, wherein the computer simulation excludes parasitic capacitance to measure a theoretical, out-of-band noise level that is free from parasitic capacitance). The feedforward capacitors 560 reduce the out-of-band noise because the feedforward capacitors 560 balance the impedance by effectively canceling some or all of the parasitic capacitance 540. Accordingly, impedance-matching between two branches can be achieved by using AC simulations instead of time-consuming transient simulations, thereby reducing time and cost in designing the DAC.

Although impedance-matching between the two branches can be accomplished, in using conventional R-2R LSB segmentation with matched impedance, the size of the resistors in R-2R will be dominated by the matching requirement of the MSB of the R-2R segmentation. Accordingly, the total circuit layout area of conventional R-2R structure might not be preferred.

Figure 6:
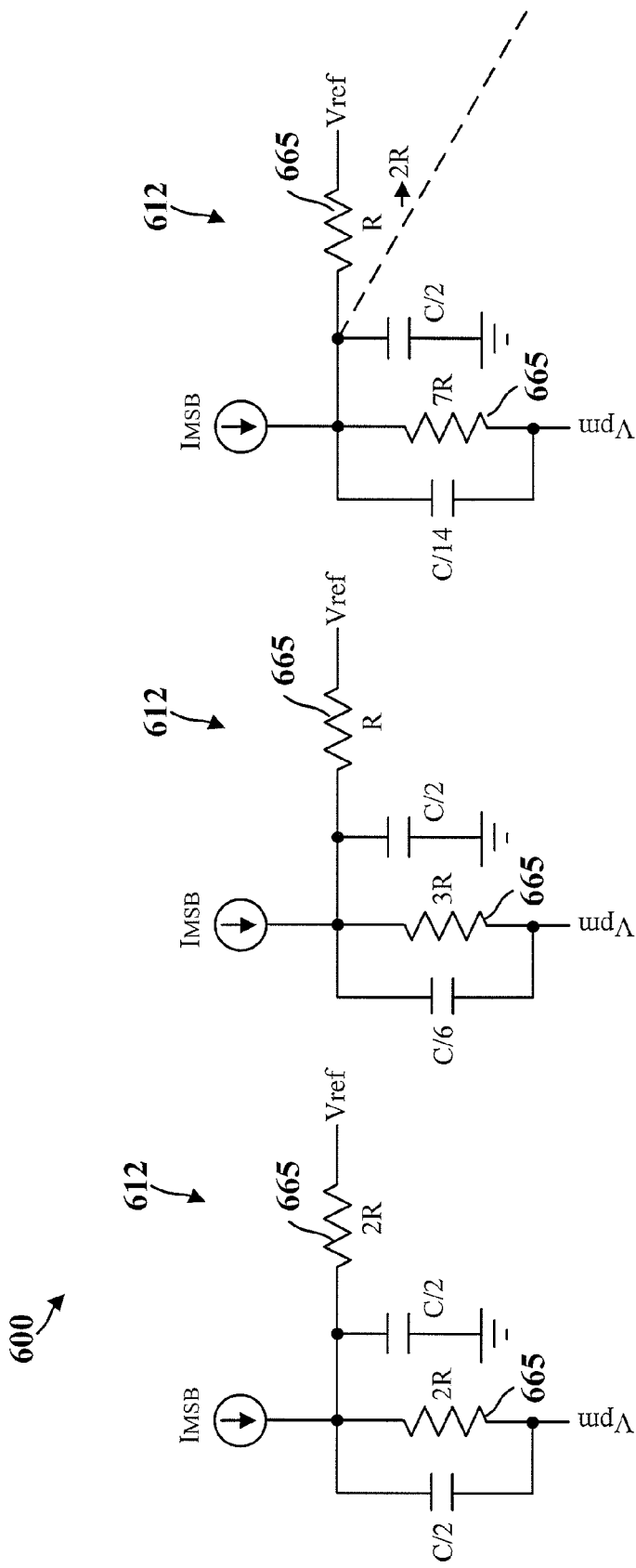
FIG. 6 is a diagram illustrating a portion of a DAC of a hybrid R-2R structure with RC tuning and matched impedance, according to an exemplary embodiment.

FIG. 6 is a diagram illustrating a portion of a DAC 600 of a hybrid R-2R structure with RC tuning and matched impedance, according to an exemplary embodiment. Referring to FIG. 6, an exemplary embodiment depicts a portion of an N-bit DAC 600 utilizing a hybrid R-2R LSB segmented structure with matched impedance. It should be noted that the N-bit DAC 600 is a current DAC, or a current mode DAC, which uses a current ladder (e.g., a resistor ladder) to develop the output current, and which is distinguishable from a voltage DAC. It should further be noted that, unlike DACs 300, 400, and 500 in FIGS. 4a, 4b, and 5, some of the LSBs are not connected in a series chain. Additionally, each of the LSBs is connected in the same manner to a same current source (e.g., $I_{MSB}$) and to a same voltage source (e.g., $V_{pm}$).

Due to the segmented architecture shown in FIG. 6, the size, or values, of the resistors 665 can be individually tuned according to matching requirements of each of the bits 612 of the DAC 600. That is, the different resistors and feedforward capacitors used in each of the bits can be designed to have different respective values (e.g., 2R, 2R, and C/2 in the bit on the left, 3R, R, and C/6 for the bit in the middle, and 7R, R, and C/14 for the bit on the right). Accordingly, because the matching requirement is not as stringent for lower bits (e.g., LSBs) of the DAC when compared to non-segmented R-2R structures, lower bits can still utilize conventional R-2R structure to take advantage of repetitive and compact design/layout made possible by using the same resistor values across the resistor ladder (i.e., R and 2R).

Additionally, with the segmented architecture of the present exemplary embodiment, because each of the bits (e.g., 612) of the DAC 600 is decoupled, the layout of the DAC 600 can be spread across a chip. That is, the various stages of the DAC 600 that correspond to the lower bits (e.g., LSBs) 612 can be physically separated from each other on a circuit layout of the DAC 600, thereby allowing other components of the circuit layout to be placed between respective stages, and thereby reducing area constraints of the layout. Furthermore, the electronic components of each bit can be tuned without affecting the tuning of other bits, thereby reducing layout constraints that would otherwise be present. Additionally, the importance of resistor-matching between bits is made less significant.

Furthermore, because less significant bits of the exemplary embodiment can have relatively smaller resistor values, the headroom for the less significant bits can be improved. Contrastingly, for the conventional R-2R architecture, because the resistor value is fixed for every bit, the headroom for the last stage, which corresponds to the last bit of the DAC, is dictated by constraints corresponding to the resistance value of the entire R-2R structure.

It should be noted that, with respect to the structure depicted in the exemplary embodiment, there is wide latitude in selecting a desired configuration for the resistors and capacitors when matching glitch noise provided by the segmented architecture with respect to determining the resistor and feedforward capacitor values for the different stages corresponding to the different bits of the DAC. The values of the resistors and capacitors may be determined by one of ordinary skill without any undue experimentation, e.g., via simulation and/or other known design practices.

FIGS. 7a-7d are example configurations of resistor and capacitor values for glitch-noise-matching, according to exemplary embodiments. Referring to FIGS. 7a-7d, there may be several factors to consider in determining resistor and capacitor values when designing an N-bit DAC 700a-d (a portion of which being shown in FIGS. 7a-7d), which utilizes a hybrid R-2R LSB segmented structure with matched impedance according to an exemplary embodiment. For example, a total equivalent resistor value seen from the outside may determine the value for the resistance in a distortion cancellation circuit (DCC), which may be coupled across the current-summing nodes 370.

For example, the impedance attenuator 305 of FIG. 4a cancels some of the equivalent resistance at the current-summing nodes 370 that is caused by the R-2R structure, while increasing the impedance at the current-summing nodes 370, thereby reducing distortion. That is, the impedance as seen from the current-summing nodes 370 is inversely proportional to the distortion introduced at the current-summing nodes 370. Furthermore, the impedance looking up from the impedance attenuator 305 toward the MSBs is relatively high. By being able to determine the total equivalent resistor value looking toward the bits of the DAC, an appropriate DCC may be designed to cancel the expected amount of distortion, which is determined based upon the equivalent impedance and resistance of the bits of the DAC as viewed from the current-summing nodes 370.

Figure 7A:
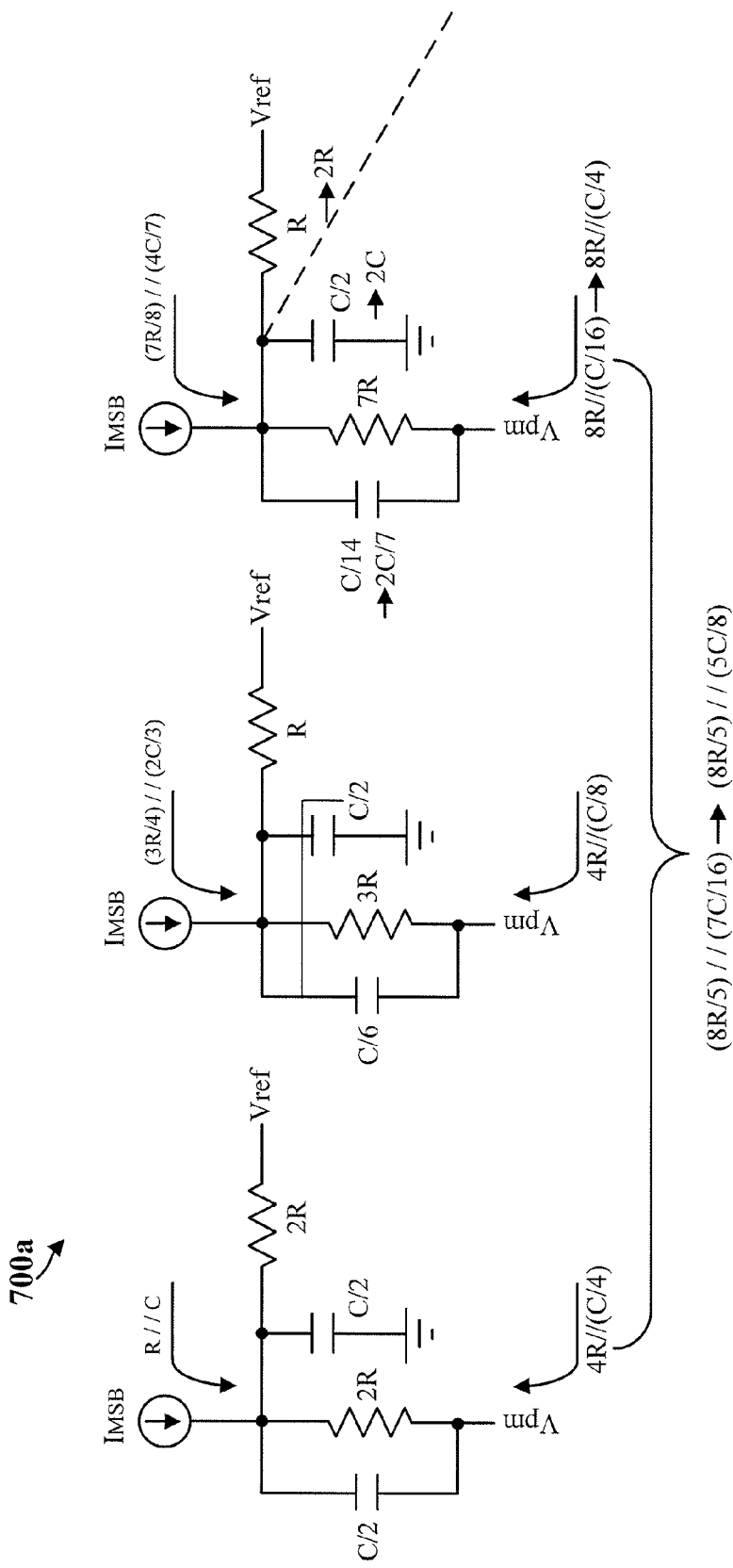
FIGS. 7a-7d are example configurations of resistor and capacitor values for glitch-noise-matching, according to exemplary embodiments.
Figure 7B:
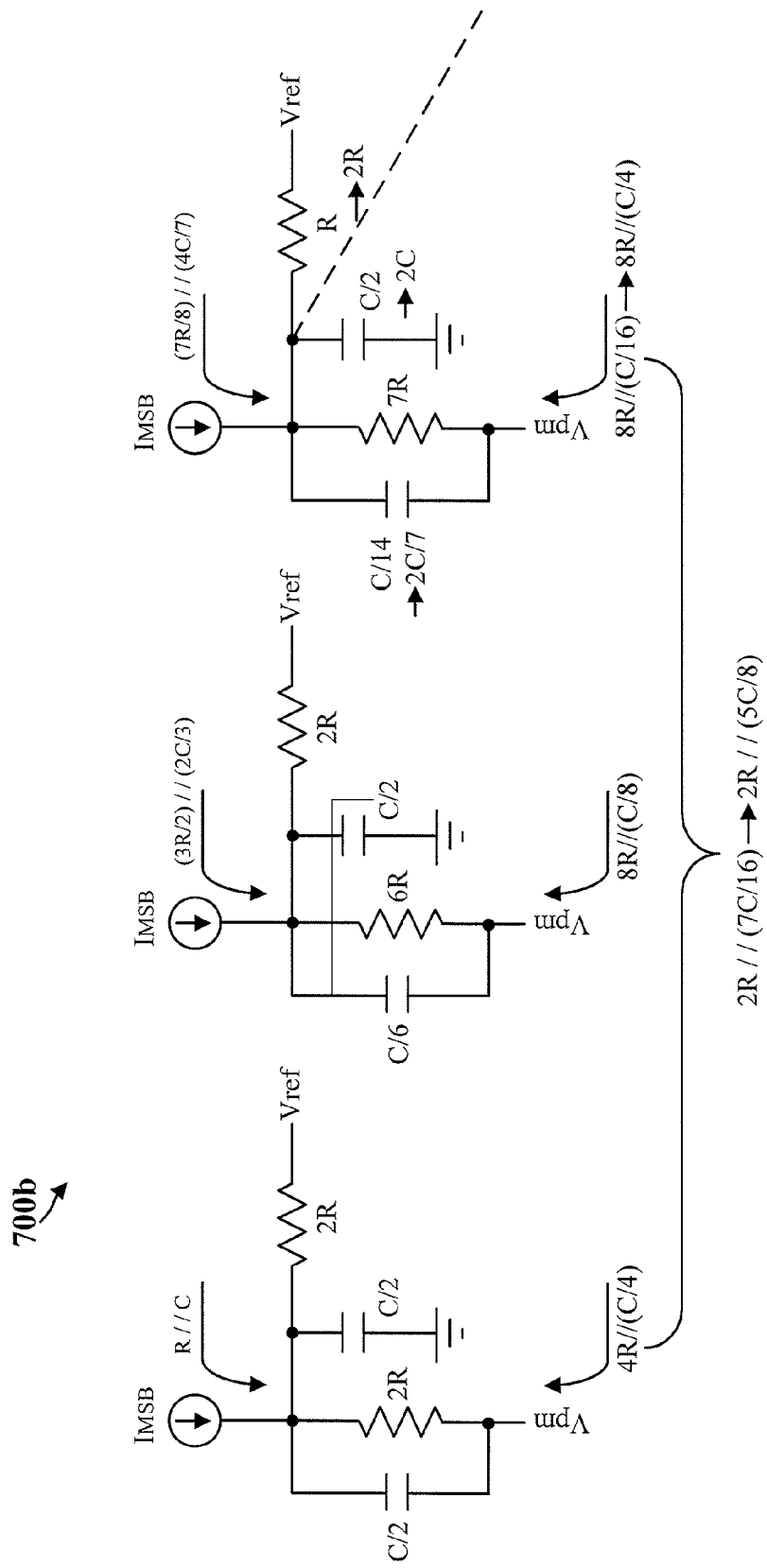
Figure 7C:
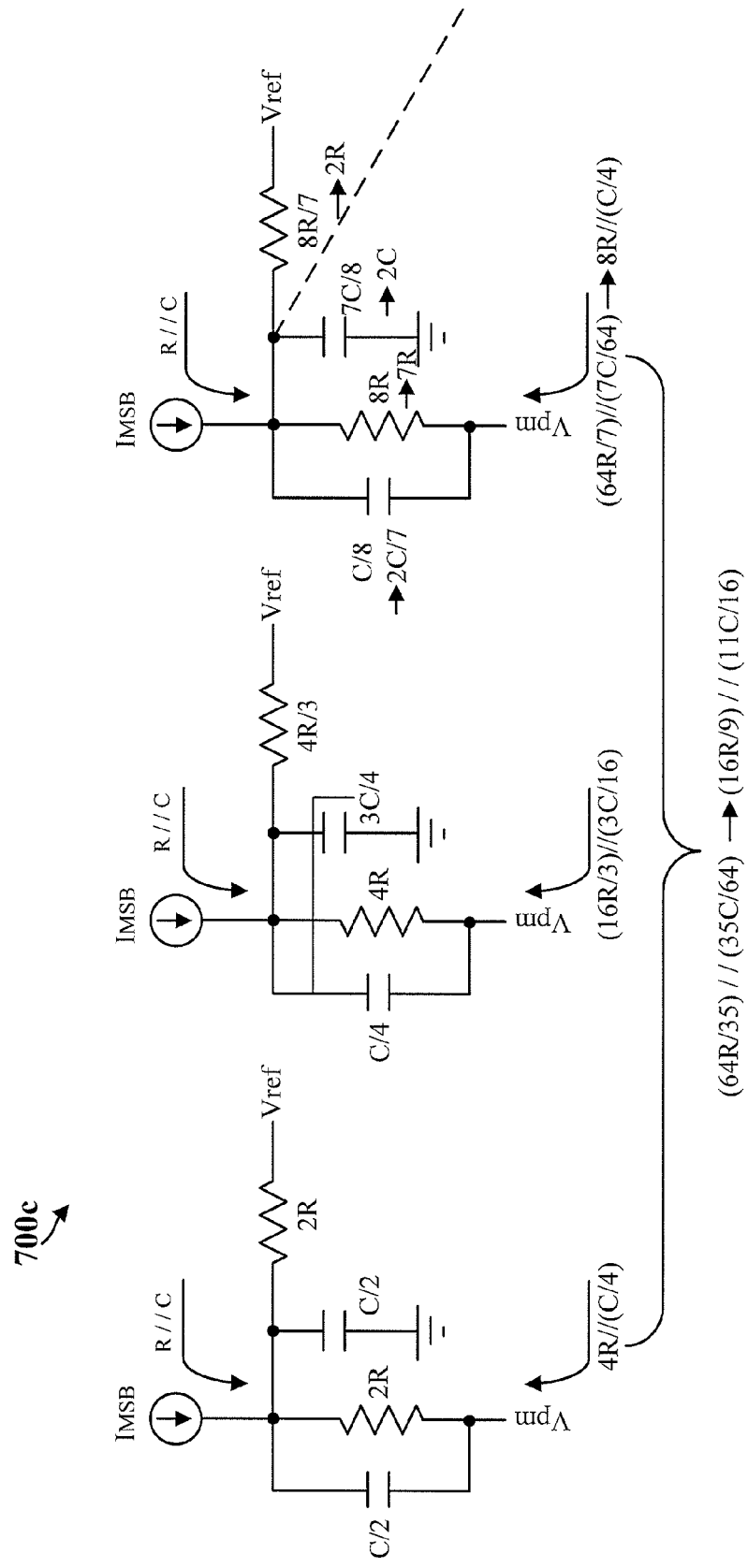
Figure 7D:
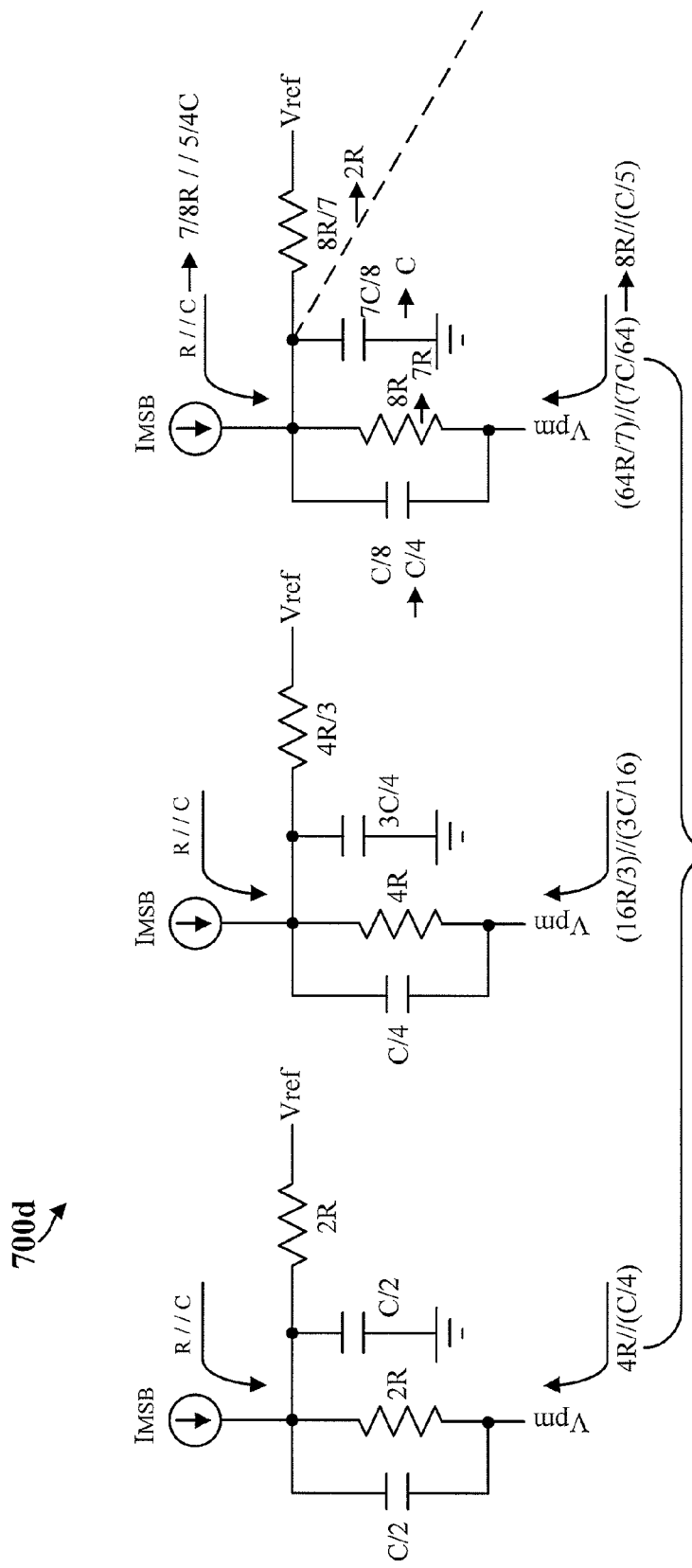

The values shown in FIGS. 7a-7d are provided merely as examples for practicing exemplary embodiments, and demonstrate factors to consider in determining resistor and capacitor values. A configuration of the DAC 700a shown in FIG. 7a has a constant 4R of output resistance for the first 2 bits, and the equivalent output resistance and time-constant are 8R/5 and 8R/5×5C/8=RC, respectively. A configuration of the DAC 700b shown in FIG. 7b has constant input/output time-constant RC for the first 2 bits, and the equivalent output resistance and time-constant are 2R and 5RC/4, respectively. A configuration of the DAC 700c shown in FIG. 7c has constant input R and C for the first 2 bits, and constant output time-constant of RC, while the equivalent output resistance and time-constant are 16R/9 and 11RC/9, respectively. Finally, a configuration of the DAC 700d shown in FIG. 7d depicts the configuration of the DAC 700c shown in FIG. 7c after the RC values are tuned in consideration of actual implementation of the DAC 700d.

Figure 8:
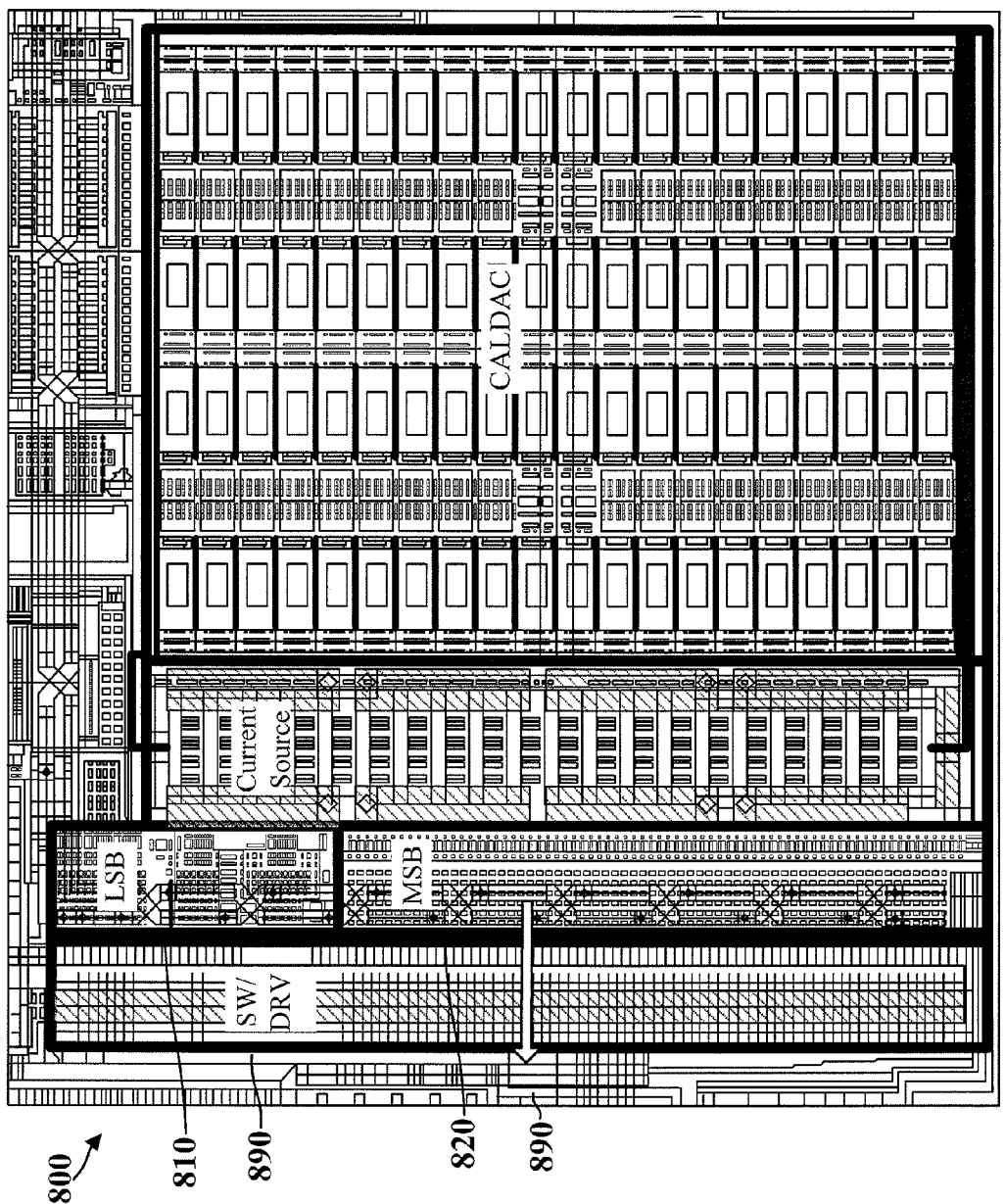
FIG. 8 is a diagram of a layout of a 14-bit current-steering DAC with 8-bit R-2R segmentation, according to an exemplary embodiment.

FIG. 8 is a diagram of a layout 800 of a 14-bit current-steering DAC with 8-bit R-2R segmentation, according to an exemplary embodiment. The layout 800 of the exemplary embodiment has 6 bits of MSB 820 and 8 bits of segmented LSB 810. The same switch drivers 890 are used for both MSB 820 and LSB 810 to match the glitch energy. These switch drivers 890 are coupled to the gates of the transistors that make up the switches (e.g., switches 375, 475, and 575). Accordingly, the signals from the switch drivers 890 for operating the switches will correspond to the digital signal inputted into the DAC. Furthermore, one clock tree 895 serves both the MSB 820 and the LSB 810.

Figure 9:
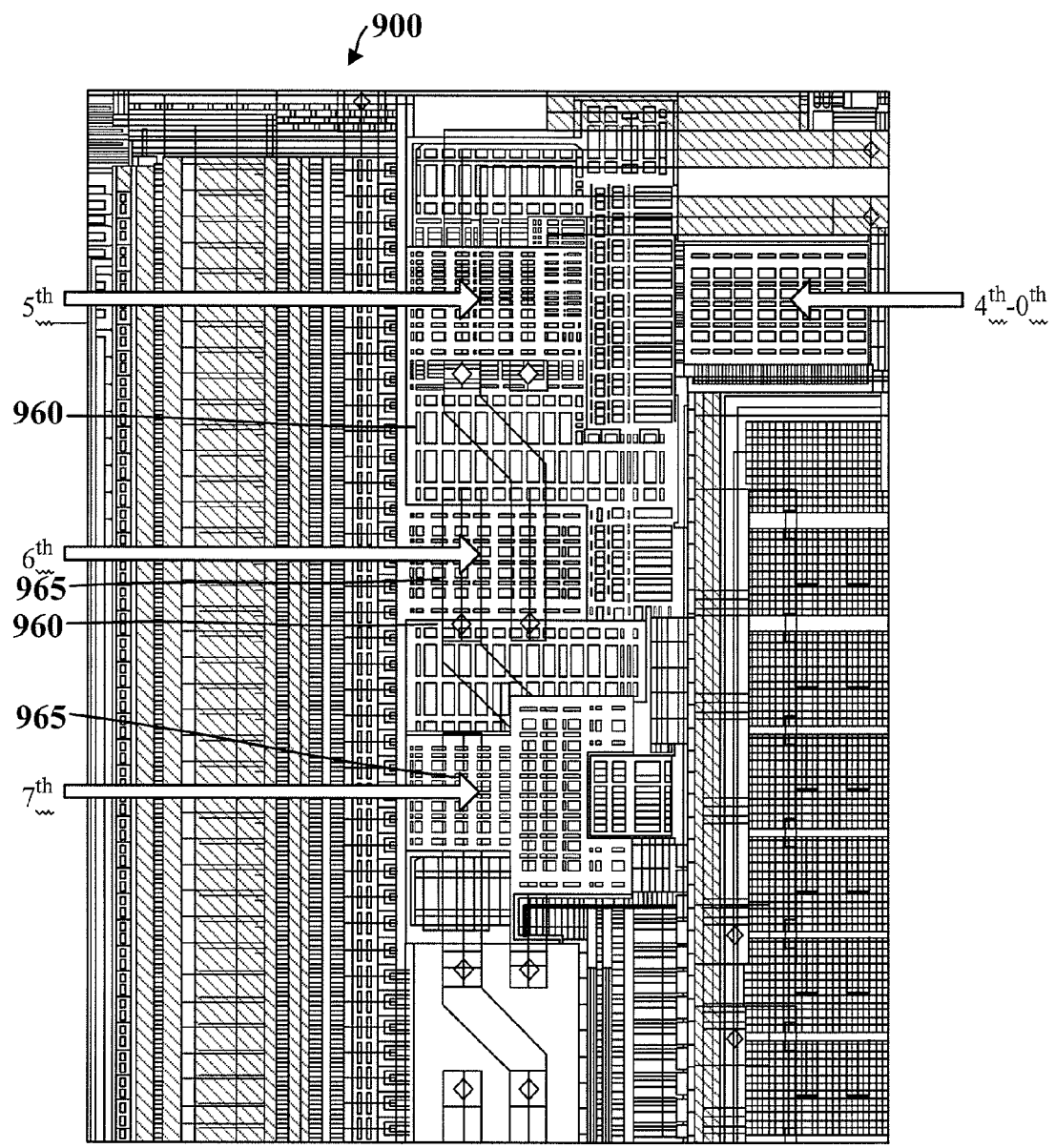
FIG. 9 is a diagram of a layout depicting the segmentation of the 14-bit DAC shown in FIG. 8.

FIG. 9 is a diagram of a layout 900 depicting the segmentation of the 14-bit DAC shown in FIG. 8. The parallel/feedforward capacitors 960 are placed between resistors 965 on the layout. As explained earlier, since resistor-matching between LSBs is not a requirement, as allowed by the segmented R-2R architecture, the first 3 bits of the LSBs (e.g., bits $5^{th}$, $6^{th}$, and $7^{th}$, or b5, b6, and b7) can be spread out. Since the first 3 bits occupy a relatively large area of the layout 900 due to matching requirements, significant flexibility is provided by having these bits segmented. The last 4 bits of the LSBs (e.g., bits $4^{th}$-$0^{th}$) are all located relatively close to each other due to the conventional R-2R architecture. Because resistors for the $4^{th}$-$0^{th}$ bits are relatively small, due to relaxed matching requirements, tight layout is not a concern.

Accordingly, as described with respect to the exemplary embodiments, the segmented DAC with R-2R LSB reduces the glitch noise at high frequencies near RX-bands, although parasitic capacitance may otherwise disrupt this reduction. In consideration of glitch matching, decoupling, and layout flexibility, the exemplary embodiments provide a hybrid segmented R-2R scheme, wherein matching requirements can be individually tuned for each bit, mismatch between bits are decoupled, and layout can be spread out and more easily arranged, as layout of each bit can be tuned without affecting other bits of the DAC. Furthermore, headroom for later stages corresponding to the bits can be relaxed because the resistance value for the less-significant bits can be lowered.

Figure 10:
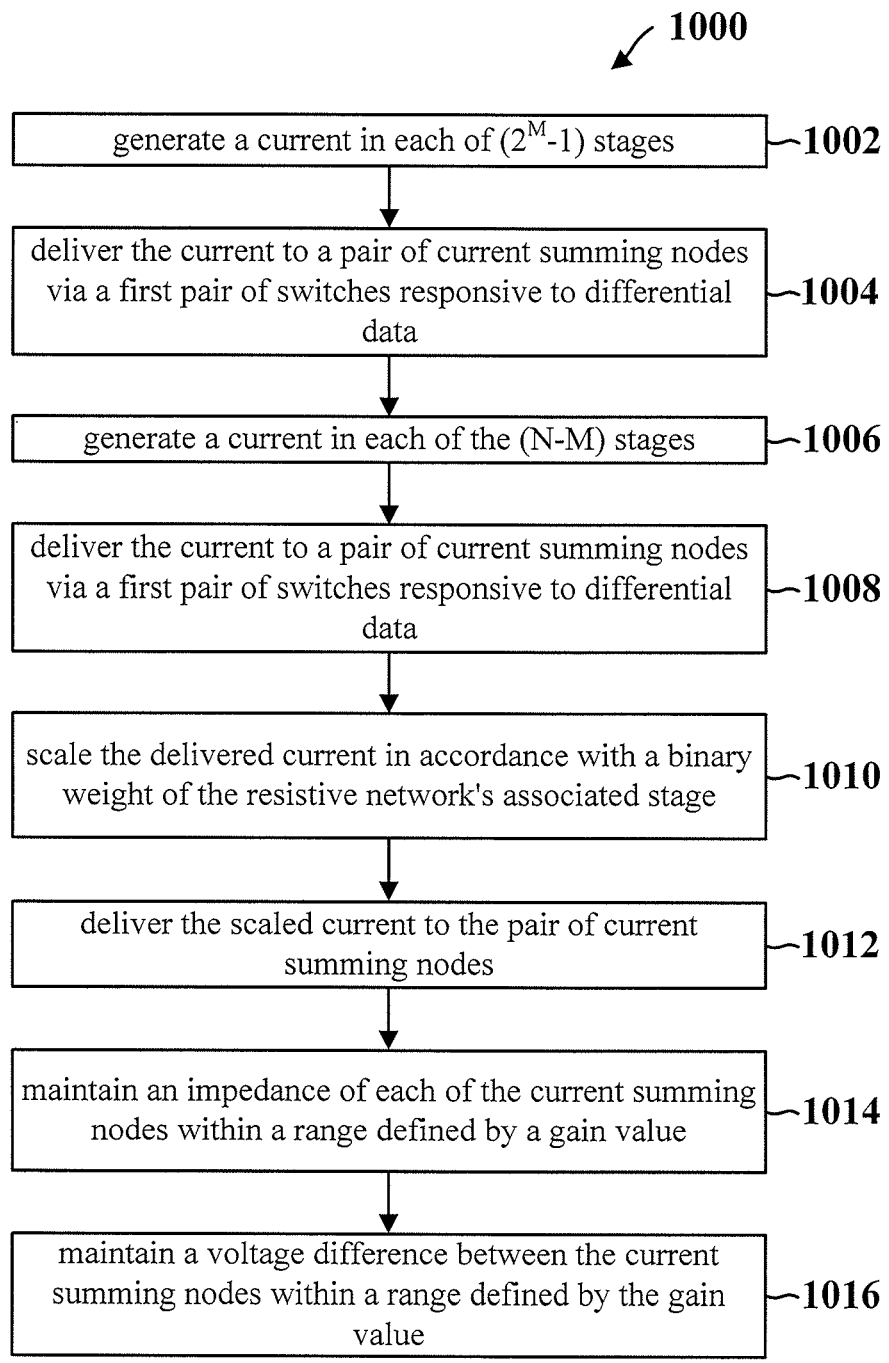
FIG. 10 is a flow chart of a method of converting an N-bit digital signal to an analog signal.

FIG. 10 is a flow chart 1000 of a method of converting an N-bit digital signal to an analog signal. The method may be performed by an apparatus, such as one or more of the hybrid R-2R segmented DACs described above with respect to the exemplary embodiments. The apparatus converts the N-bit digital signal to an analog signal. The apparatus may have ($2^M$–1) parallel stages associated with M most significant bits of the digital data. The apparatus may have (N-M) stages associated with (N-M) least significant bits of the digital data such that at least one of the (N-M) stages is separated from all remaining stages of the N-bit DAC. The apparatus may have (N-M) resistive networks, each associated with a different one of the (N-M) stages.

In 1002, the apparatus may generate a current in each of ($2^M$–1) stages. In 1004, the apparatus may deliver the current to a pair of current-summing nodes via a first pair of switches responsive to differential data. In 1006, the apparatus may generate a current in each of the (N-M) stages. In 1008, the apparatus may deliver to each of the (N-M) resistive networks the current generated in its associated stage via a second pair of switches responsive to differential data. In 1010, the apparatus may scale the delivered currents in accordance with a binary weight of a stage corresponding to the resistive network. In 1012, the apparatus may deliver the scaled currents to the pair of current-summing nodes. In 1014, the apparatus may maintain an impedance of each of the current-summing nodes within a range defined by a gain value. In 1016, the apparatus may maintain a voltage difference between the current-summing nodes within a range defined by the gain value. The difference in the currents delivered to the current-summing nodes defines a value of the analog signal.

The apparatus may have, for each of the (N-M) networks, a first capacitive element coupled in parallel with a first resistive element of the resistive network, a second capacitive element coupled in parallel with a second resistive element of the resistive network, a third resistive element coupled in series with the first capacitive element and the first resistive element, and a fourth resistive element coupled in series with the second capacitive element and the second resistive element. The apparatus may have the capacitive elements of a respective one of the (N-M) stages between the resistive elements of the respective one of the (N-M) stages and the resistive elements of an adjacent one of the (N-M) stages on an integrated chip (IC) layout. The apparatus may have different (N-M) resistive networks having different impedances, and may have individually tuned resistive elements or the capacitive elements of one or more of the (N-M) resistive networks according to matching specifications of the (N-M) least significant bits. The apparatus may have MOS transistors as the second pair of switches, and may have the capacitive elements of one of the (N-M) resistive networks may each have a capacitance substantially twice that of a drain-to-substrate capacitance of a respective one of the MOS transistors. The apparatus may have respective (N-M) stages separated from adjacent (N-M) stages with respective capacitive elements therebetween on an IC layout. The apparatus may have the capacitive elements associated with an (N-M)$^{th}$ stage of the (N-M) stages between the (N-M)$^{th}$ stage and an (N-M–1)$^{th}$ stage of the (N-M) stages on an IC layout. The apparatus may have the switches and switch drivers scaled corresponding to the various stages to match glitch noise corresponding to the ($2^M$-1) stages with glitch noise corresponding to the (N-M) stages.

In one configuration, an N-bit DAC (e.g., 300 in FIG. 4a, 400 in FIG. 4b, 500 in FIG. 5, 600 in FIG. 6, or 700a-d in FIGS. 7a-d, respectively) includes ($2^M$–1) parallel stages associated with M most significant bits (e.g., stages associated with MSB bits 320 in FIG. 4a, stages associated with MSB bits 420 in FIG. 4b, or stages associated with MSB bits 820 in FIG. 8) of digital data (e.g., digital data or digital signals inputted into DAC 300, 400, 500, 600, or 700a-d), means for generating a first current (e.g., Vdd and stages associated with bits 320 in FIG. 4a or bits 420 in FIG. 4b) in each of the ($2^M$–1) stages, means for delivering the generated first current to a pair of current-summing nodes (e.g., 370 in FIG. 4a, or 470 in FIG. 4b) via a first pair of switches (e.g., 374a, 374b in FIG. 4a, or 474a, 474b in FIG. 4b) responsive to differential data (e.g., data corresponding to D, Db in FIG. 4a or 4b), (N-M) stages associated with (N-M) least significant bits (e.g., 310 in FIG. 4a, 410 in FIG. 4b, 510 in FIG. 5, 612 in FIG. 6, or 810 in FIG. 8) of the digital data such that at least one of the (N-M) stages (e.g., stage associated with middle bit 612 in FIG. 6, or stage associated with bit 7$^{th}$ in FIG. 9) is separated from all remaining stages of the N-bit DAC, means for generating a second current (e.g., Vdd and stages associated with bits 320 in FIG. 4a, 420 in FIG. 4b, or 520 in FIG. 5, or current source $I_{MSB}$ and stages associated with bits 612 in FIG. 6) in each of the (N-M) stages, (N-M) resistive networks (e.g., networks containing resistors R and 2R in FIG. 4a, 4b, or 5, or networks containing resistors 665 in FIG. 6), each associated with a different one of the (N-M) stages, means for delivering to each of the (N-M) resistive networks the second current generated in its associated stage via a second pair of switches (e.g., 375a, 375b in FIG. 4a, or 475a, 475b in FIG. 4b, or 575a, 575b in FIG. 5) responsive to differential data (e.g., data corresponding to D, Db in FIG. 4a, 4b, or 5), means for scaling the respective current delivered to each resistive network in accordance with a binary weight of a corresponding stage of the resistive network, means for delivering the scaled currents to the pair of current-summing nodes (e.g., 370 in FIG. 4a, 470 in FIG. 4b, or 570 in FIG. 5), means for maintaining an impedance (e.g., 305 in FIG. 4a, or 405 in FIG. 4b) of each of the current-summing nodes (370, 470, or 570) within a range defined by a gain value (e.g., gain value of differential amplifier 308 in FIG. 4a, or 408 in FIG. 4b), and means for maintaining a voltage difference (305 or 405) between the current-summing nodes (370 or 470) within a range defined by the gain value, the difference in the currents delivered to the current-summing nodes (370, 470, or 570) defining a value of the analog signal (e.g., the analog signal produced by DAC 300, 400, 500, 600, or 700a-d). The means for generating a first current in each of the ($2^M$–1) stages is each of the ($2^M$–1) stages (e.g., Vdd and stages associated with the MSB bits 320, 420, or 820). The means for delivering the generated first current to a pair of current-summing nodes (370, or 470) via a first pair of switches (374a, 374b or 474a, 474b) are the first pair of switches (374a, 374b or 474a, 474b) and wiring connected thereto. The means for generating a second current in each of the (N-M) stages (e.g., stages associated with bits 310, 410, 510, or 612) is each of the (N-M) stages (e.g., Vdd and the stages associated with bits 310, 410, or 510, or current sources $I_{MSB}$ and the stages associated with bits 612). The means for delivering to each of the (N-M) resistive networks the second current generated in its associated stage via a second pair of switches (375a, 375b, or 475a, 475b, or 575a, 575b) are the second pair of switches (375a, 375b, or 475a, 475b, or 575a, 575b) and wiring connected thereto. The means for scaling the current delivered to each resistive network in accordance with a binary weight of a stage corresponding to the resistive network is the R-2R structure (e.g., the R-2R structure shown in FIGS. 3-7d) of the DAC (300, 400, 500, 600, or 700a-d). The means for delivering the scaled currents to the pair of current-summing nodes (370, 470, or 570) are wirings connected to the pair of current-summing nodes (370, 470, or 570). The means for maintaining an impedance of each of the current-summing nodes is the impedance attenuator (305 or 405). The means for maintaining a voltage difference between the current-summing nodes is the impedance attenuator (305 or 405). The difference in the scaled currents delivered to different nodes of the pair of current-summing nodes (370, 470, or 570) defines a value of the analog signal (the analog signal produced by DAC 300, 400, 500, 600, or 700a-d).

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An N-bit digital-to-analog converter (DAC) comprising:
   ($2^M-1$) parallel stages associated with M most significant bits of the DAC, each stage of the ($2^M-1$) parallel stages being configured to generate and to deliver a first current to a pair of current-summing nodes of the DAC via a first pair of switches responsive to differential data; and
   (N-M) stages associated with (N-M) least significant bits of the DAC, each stage of the (N-M) stages comprising a resistive network and a second pair of switches, each stage of the (N-M) stages being configured to generate and to deliver a second current via the second pair of switches to the resistive network of the stage in response to differential data, each resistive network being configured to scale the respectively delivered currents according to a binary weight of a stage corresponding to the resistive network, and to deliver the scaled currents to the pair of current-summing nodes,
   wherein at least one of the (N-M) stages is separated from all remaining stages of the N-bit DAC.

2. The N-bit DAC of claim 1, wherein each stage of the (N-M) stages comprises:
   a first capacitive element coupled in parallel with a first resistive element of the resistive network of the stage; and
   a second capacitive element coupled in parallel with a second resistive element of the resistive network of the stage.

3. The N-bit DAC of claim 2, wherein each stage of the (N-M) stages further comprises:
   a third resistive element in series with the first capacitive element and the first resistive element; and
   a fourth resistive element in series with the second capacitive element and the second resistive element.

4. The N-bit DAC of claim 2, wherein the first and second capacitive elements of a respective one the (N-M) stages are located between the first and second resistive elements of the respective one of the (N-M) stages and the first and second resistive elements of an adjacent one of the (N-M) stages on an integrated chip (IC) layout of the DAC.

5. The N-bit DAC of claim 2, wherein the resistive networks of respective (N-M) stages have respective impedances.

6. The N-bit DAC of claim 1, further comprising an impedance attenuator comprising a differential amplifier coupled to the pair of current-summing nodes, the impedance attenuator being configured to maintain an impedance of each node of the current-summing nodes, and to maintain a voltage difference between the current-summing nodes within a range defined by a gain of the differential amplifier.

7. The N-bit DAC of claim 2, wherein the second pair of switches comprise MOS transistors, and
   wherein the capacitive elements of one of the (N-M) stages each have a capacitance that is substantially twice that of a drain-to-substrate capacitance of a respective one of the MOS transistors.

8. The N-bit (DAC) of claim 2, wherein respective (N-M) stages are separated from adjacent (N-M) stages by respective capacitive elements on an integrated chip (IC) layout of the DAC.

9. The N-bit DAC of claim 2, wherein the capacitive elements of an $(N-M)^{th}$ stage of the (N-M) stages separate the $(N-M)^{th}$ stage from an $(N-M-1)^{th}$ stage of the (N-M) stages on an integrated chip (IC) layout of the DAC, the $(N-M)^{th}$ stage corresponding to an $N^{th}$ bit.

10. The N-bit DAC of claim 1, further comprising switch drivers corresponding to the ($2^M-1$) and (N-M) stages,
   wherein the switches and switch drivers are scaled to match glitch noise corresponding to the ($2^M-1$) stages with glitch noise corresponding to the (N-M) stages.

11. A method of converting an N-bit digital signal to an analog signal, the method comprising:
   generating a first current in each stage of ($2^M-1$) parallel stages associated with M most significant bits of the digital signal;
   delivering each of the first currents to a pair of current-summing nodes via a first pair of switches responsive to differential data;
   generating a second current in each stage of (N-M) stages associated with (N-M) least significant bits of the digital signal, at least one of the (N-M) stages being separated from all remaining stages of the N-bit DAC;
   delivering to each network of (N-M) resistive networks the second current generated in its associated stage via a second pair of switches responsive to differential data, each network being associated with a respective one of the (N-M) stages;

scaling the respectively delivered currents in accordance with a binary weight of a stage corresponding to the resistive network;

delivering the scaled currents to the pair of current-summing nodes;

maintaining an impedance of each node of the pair of current-summing nodes within a range defined by a gain value; and maintaining a voltage difference between the current-summing nodes within a range defined by the gain value, the difference in the scaled currents delivered to different nodes of the pair of current-summing nodes defining a value of the analog signal.

12. The method of claim 11, wherein, for each network of the (N-M) networks:

a first capacitive element is coupled in parallel with a first resistive element of the resistive network; and a second capacitive element is coupled in parallel with a second resistive element of the resistive network.

13. The method of claim 12, wherein, for each network of the (N-M) networks:

a third resistive element is coupled in series with the first capacitive element and the first resistive element; and a fourth resistive element is coupled in series with the second capacitive element and the second resistive element.

14. The method of claim 12, wherein the first and second capacitive elements of a respective one of the (N-M) stages are between the first and second resistive elements of the respective one of the (N-M) stages and the first and second resistive elements of an adjacent one of the (N-M) stages on an integrated chip (IC) layout of the DAC.

15. The method of claim 12, wherein respective (N-M) resistive networks have respective impedances.

16. The method of claim 12, wherein the second pair of switches comprise MOS transistors, and wherein the capacitive elements of one of the (N-M) resistive networks each have a capacitance substantially twice that of a drain-to-substrate capacitance of a respective one of the MOS transistors.

17. The method of claim 12, wherein respective (N-M) stages are separated from adjacent (N-M) stages by respective capacitive elements placed therebetween on an integrated chip (IC) layout of the DAC.

18. The method of claim 12, wherein the capacitive elements associated with an $(N-M)^{th}$ stage of the (N-M) stages are placed between the $(N-M)^{th}$ stage and an $(N-M-1)^{th}$ stage of the (N-M) stages on an integrated chip (IC) layout of the DAC.

19. The method of claim 11, wherein the switches and switch drivers are scaled corresponding to the various stages to match glitch noise corresponding to the $(2^M-1)$ stages with glitch noise corresponding to the (N-M) stages.

20. An N-bit digital-to-analog converter (DAC) comprising:

$(2^M-1)$ parallel stages associated with M most significant bits of digital data;

means for generating a first current in each stage of the $(2^M-1)$ stages;

means for delivering the generated first current to a pair of current-summing nodes via a first pair of switches responsive to differential data;

(N-M) stages associated with (N-M) least significant bits of the digital data such that at least one of the (N-M) stages is separated from all remaining stages of the N-bit DAC;

means for generating a second current in each stage of the (N-M) stages;

(N-M) resistive networks, each associated with a respective one of the (N-M) stages;

means for delivering to each network of the (N-M) resistive networks the second current generated in its associated stage via a second pair of switches responsive to differential data;

means for scaling the current delivered to each resistive network in accordance with a binary weight of a stage corresponding to the resistive network;

means for delivering the scaled currents to the pair of current-summing nodes;

means for maintaining an impedance of each node of the pair of current-summing nodes within a range defined by a gain value; and means for maintaining a voltage difference between the current-summing nodes within a range defined by the gain value, the difference in the scaled currents delivered to different nodes of the pair of current-summing nodes defining a value of an analog signal produced by the N-bit DAC.

21. The N-bit DAC of claim 20, wherein, for each network of the (N-M) resistive networks:

a first capacitive element is coupled in parallel with a first resistive element of the resistive network; and a second capacitive element is coupled in parallel with a second resistive element of the resistive network.

22. The N-bit DAC of claim 21, wherein, for each network of the (N-M) networks:

a third resistive element is coupled in series with the first capacitive element and the first resistive element; and a fourth resistive element is coupled in series with the second capacitive element and the second resistive element.

23. The N-bit DAC of claim 21, wherein the first and second capacitive elements of a respective one of the (N-M) stages are between the first and second resistive elements of the respective one of the (N-M) stages and the first and second resistive elements of an adjacent one of the (N-M) stages on an integrated chip (IC) layout of the DAC.

24. The N-bit DAC of claim 21, wherein respective resistive networks have respective impedances.

25. The N-bit DAC of claim 24, wherein the resistive elements or the capacitive elements of one or more of the (N-M) stages are individually tuned according to matching specifications of the (N-M) least significant bits.

26. The N-bit DAC of claim 21, wherein the second pair of switches comprise MOS transistors, and wherein one of the capacitive elements has a capacitance that is substantially twice that of a drain-to-substrate capacitance of a corresponding one of the MOS transistors.

27. The N-bit DAC of claim 21, wherein respective capacitive elements are between respective (N-M) stages and adjacent (N-M) stages on an integrated chip (IC) layout of the DAC.

28. The N-bit DAC of claim 21, wherein the capacitive elements of an $(N-M)^{th}$ stage of the (N-M) stages are between the $(N-M)^{th}$ stage and an $(N-M-1)^{th}$ stage of the (N-M) stages on an integrated chip (IC) layout of the DAC.

29. The N-bit DAC of claim 20, further comprising:

means for driving switches corresponding to the various stages; and means for scaling the switches and the means for driving switches to match glitch noise corresponding to the ($2^M-1$) stages with glitch noise corresponding to the (N-M) stages.

30. The N-bit DAC of claim 1, wherein the resistive networks of the (N-M) stages comprise a segmented R-2R structure of discontinuous partitions.

* * * * *